United States Patent [19]

Davis

[11] 4,123,725
[45] Oct. 31, 1978

[54] PHASE LOCKED LOOP SYSTEM

[75] Inventor: Manfred Davis, Bronx, N.Y.

[73] Assignee: Transcience Industries, Inc., Stamford, Conn.

[21] Appl. No.: 788,377

[22] Filed: Apr. 18, 1977

[51] Int. Cl.² ............................................. H03B 3/04
[52] U.S. Cl. .......................................... 331/8; 331/28; 331/36 C; 331/116 R; 331/117 R; 331/177 V
[58] Field of Search ................... 331/8, 18, 25, 28, 34, 331/36 R, 36 C, 46, 47, 55, 172

[56] References Cited

U.S. PATENT DOCUMENTS

| | | | |
|---|---|---|---|
| 3,223,942 | 12/1965 | Smenlers | 331/8 |
| 3,323,513 | 6/1967 | Gnadke | 331/177 R |
| 3,419,817 | 12/1968 | Hahnel | 331/116 R |
| 3,935,541 | 1/1976 | Amend et al. | 331/8 X |

OTHER PUBLICATIONS

Blanchard et al., "Get Stable Power by Subharmonic Lock," Microwaves, Jul. 1970, pp. 42–45, 331–347.
Huntoon et al., "Synchronization of Oscillators," Proceedings of the IRE, vol. 35, Dec. 1947, pp. 1415–1423, 331–172.

*Primary Examiner*—Siegfried H. Grimm
*Attorney, Agent, or Firm*—Martin Lu Kacher

[57] ABSTRACT

A phase locked loop system is described which controls and locks the frequency of a UHF transmitter to a desired frequency without the need for complex circuitry. A voltage controlled oscillator provides an output signal at the desired frequency and is controlled by an error signal from a phase detector. A harmonic resonator connected to the phase detector is tuned to a frequency which is approximately equal to the desired frequency but is displaced therefrom slightly in frequency. A reference frequency source at a subharmonic of the desired frequency is coupled to the resonator and the output signal is also coupled to the phase detector so as to generate the error signal which locks the voltage controlled oscillation precisely at the desired frequency.

16 Claims, 1 Drawing Figure

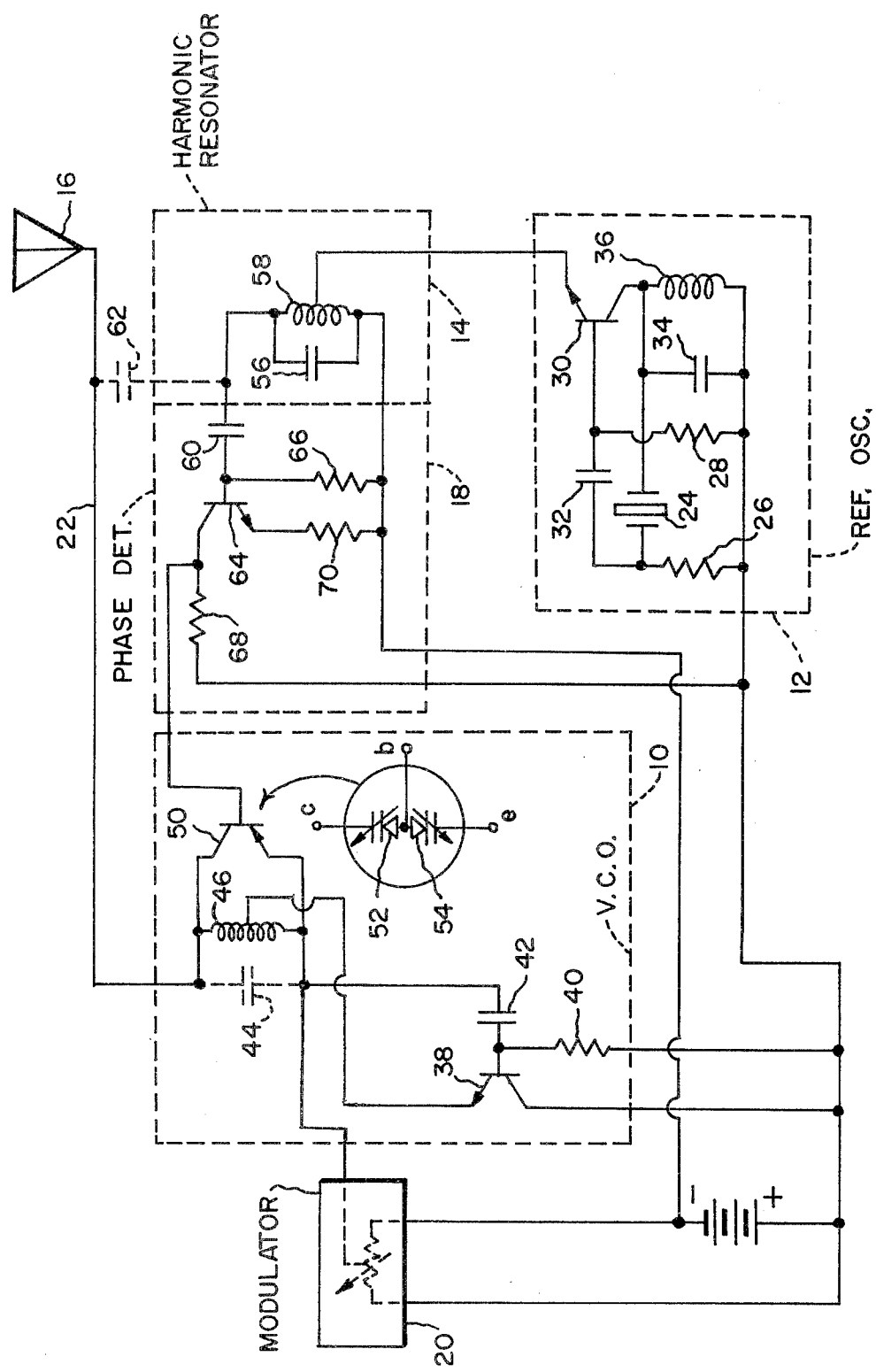

PHASE LOCKED LOOP SYSTEM

The present invention relates to a phase locked loop system and particularly to a system which provides error signals to lock an oscillator precisely at a desired frequency.

The invention is especially suitable for use in miniature transmitters operative at U.H.F. frequencies and enables the emissions of such transmitters to be of stability to satisfy regulations imposed by governmental agencies without the need for circuit complexities or expensive componentry.

Phase lock loop systems which have been proposed involve the use of offset mixers, multipliers, dividers, multiplicities of phase detectors, spectrum generators and sweep circuits in order to lock an oscillator at a precise frequency established by a reference oscillator. Reference may be had to the following U.S. Patents for descriptions of such phase locked loop systems, U.S. Pat. Nos. 3,638,135; 3,688,212; 3,793,594; 3,838,354; 3,904,980; 3,916,334; 3,916,335; and 4,009,448.

The complexities arising out of the complex componentry of such phase lock looped systems makes them unsuitable for miniature equipment which must be produced at low cost. However, the precision of frequency control for which such systems are designed is nevertheless required.

It is therefore an object of the present invention to provide an improved phase lock loop system which enables obtaining precise frequency control without complexity.

It is another object of the present invention to provide improved U.H.F. oscillator and/or transmitter apparatus which can phase lock to a desired U.H.F. frequency with high precision without the need for a source of stable U.H.F. oscillations.

It is an object of the present invention to provide improved phase locking circuit apparatus which is capable of generating error signals for locking a U.H.F. oscillator.

Briefly described, a phase locked loop system embodying the invention uses a reference oscillator. A harmonic resonator, which may be implemented by a high Q tank circuit and is tuned to a frequency which is a harmonic of the reference but deviates therefrom slightly, say less than 1% of the harmonic frequency, is coupled to the reference oscillator and provides an input to a phase detector. The phase detector may be the base to emitter junction (effectively a diode) of a transistor which also affords amplification and outputs an error signal. The other input to the phase detector is the output signal of an oscillator which is to be controlled and locked to the reference oscillator at the harmonic frequency. At U.H.F. frequencies loose coupling between a conductor carrying the output signal, say to an antenna, and the conductor or a capacitor connecting the harmonic resonator to the phase detector may be provided. The error signal is applied to the controlled oscillator whereby to lock it to the desired frequency which is the harmonic frequency.

The foregoing and other objects, advantages and features of the invention and a preferred embodiment thereof which provides a phase locked U.H.F. transmitter will be more apparent from the schematic diagram thereof shown in the accompanying drawing which is a single FIGURE.

The transmitter shown in the drawing may be contained on a single printed circuit board. The transmitter includes a voltage controlled oscillator 10, a reference or standard oscillator 12, a harmonic resonator 14, and a phase detector 18. The output signal from the oscillator 10 is transmitted by means of an antenna 16. The oscillator 10 is connected to a modulator 20 which may modulate the output signal which is at a U.H.F. frequency, say 173 MHz at an audio rate. The output stage of the modulator may be a transistor which chops the B+ voltge supplied by a battery to power the oscillator 10 at the audio rate. The modulator effectively provides a variable resistance as diagrammatically shown by the dashed line resistor symbol. Modulation may be 100%.

The phase locked loop system may be made and used as a separate component in which event the reference oscillator 12, resonator 14 and phase detector may be fabricated on a separate circuit board or integrated circuit element.

The reference oscillator 12 is a crystal controlled oscillator having a crystal 24 connected between base and collector of a transistor 30 through a capacitor 32. The capacitor 32 may be omitted if the capacitance of the crystal is high enough to develop bias voltage for the transistor 30. A tuned circuit of a capacitor 34 and inductor 36 is connected from the collector of the transistor to B+ and is part of the frequency determining circuit of the oscillator 12. Bias voltages are developed by the resistors 26 and 28. The oscillator operates at a subharmonic of the desired frequency of the output signal from the controlled oscillator 10 (viz, the product of $1/n$ and the reference frequency where $n$ is an integer preferably greater than one). This may be about 43 MHz so that the desired frequency is at the fourth harmonic of the reference oscillator frequency. Other subharmonics may of course be used, for example at lower frequencies.

The controlled oscillator 10 includes a transistor 38, the operating point of which is set by a resistor 40. A frequency determining circuit including an inductor 46 and a capacitor 44 which is provided by the capacitance of the antenna 16 is connected between base and emitter of the transistor 38 via a capacitor 42 and thus provides feedback for sustaining oscillations at the desired output frequency. The inductor 46 may be provided by a coil formed in part by printed circuitry and the inductance thereof may be varied by changing the number of turns or the proximity of the turns of the coil.

A transistor 50 which is connected across the inductor 46 provides a variable capacitance device. The transistor effectively provides a pair of voltage variable capacitors 52 and 54 between its base and its collector and emitter, respectively. The error voltage from the phase detector 18 is applied to the base of the transistor 50 and varies the capacitance across the inductor 46 to control the frequency of the oscillator 10.

The harmonic resonator 14 is provided by a high Q tank circuit made up of an inductor 58 and a capacitor 56 in parallel with each other. This tank circuit is tuned to be resonant at the harmonic frequency plus or minus a slight displacement depending upon the desired phase of the error signal to bring the controlled oscillator 10 into phase lock exactly at the harmonic frequency. The frequency at which the tank circuit is resonant may be expressed as $(nf_{REF} \pm \Delta f)$, where $f_{REF}$ is the reference frequency from the reference oscillator 12, $\Delta f$ is the deviation, and $n$ is the harmonic number. $\Delta f$ is suitably less than 1% of $nf_{REF}$. For example for a frequency $nf_{REF}$ of about 173 MHz $\Delta f$ may be equal or less than 1 MHz. The inductor 58 may, like the inductor 46 be provided by a coil and printed wiring on the circuit board. The number of turns or spacing of the coils may be adjusted to adjust the tuning of the resonator 14.

The phase detector 18 is provided by a transistor 64 having a collector resistor 68 and an emitter or feedback resistor 70. The load is isolated from the base circuit and the Q of the resonator tank circuit remains high. The operating point is established in the base emitter circuit by the junction diode effectively provided between base and emitter and is set by a resistor 66. This junction diode provides phase detection in response to the signals applied across the base to emitter (viz, across the diode). The signals developed across the resonator are coupled to the phase detector transistor by way of a coupling capacitor 60. This capacitor and or the connection between the tank circuit of the resonator 14 and the base of the transistor may be coupled to the connection 22 from the antenna 16 to the controlled oscillator 10 by being spaced adjacent to each other on the printed circuit board. This coupling is shown as the distributed capacitance 62. The output signal is therefore loosely coupled into the phase detector 18. A field effect transistor may also be used to provide the phase detector active element.

In the event an antenna connection is not available or if the phase locked loop system is used as a separate component the output signal from the oscillator to be controlled may be injected at the emitter of the transistor 64.

The amplified error signal from the phase detector serves to phase lock the oscillator to the precise frequency desired (viz., $nf_{REF}$) by varying the capacitance presented in the frequency determining circuit of the controlled oscillator 10 by the transistor 50. The following listing of components is given by way of example of a presently preferred embodiment.

| Transistors | 30 | MPSH-11 |
|---|---|---|
| | 38 | MPSH-11 |
| | 50 | 2N4250 |
| | 64 | 2N5770 |
| Inductor | 36 | 0.68 uh |
| Capacitors | 32 | 100 pf |
| | 34 | 25 pf |
| | 42 | 2.2 pf |
| | 56 | 4.7 pf |
| | 60 | 4.7 pf |
| Resistors | 26 | 100 K ohms |
| | 28 | 100 K ohms |
| | 40 | 47 K ohms |
| | 66 | 100 K ohms |
| | 68 | 33 K ohms |
| | 70 | 100 K ohms |

From the foregoing description it will be apparent that there has been provided an improved phase locked system and U.H.F. transmitter embodying the same. Variations and modifications in the hereindescribed system and transmitter will undoubtedly suggest themselves to those skilled in the art. Accordingly, the foregoing description should be taken as illustrative and not in any limiting sense.

What is claimed is:

1. Apparatus for generating a control signal representing deviations from a certain frequency of a signal from a source which comprises
    circuit means resonant at a frequency which differs slightly from said certain frequency,
    means for applying signals having a frequency which is the product of 1/n and said certain frequency, where n is an integer, to said circuit means,
    phase detector means responsive to the signal from said source and having an input and an output, said input being coupled to said circuit means and to said source such that the signals from both said circuit means and said source are applied together to said input for phase detection and for providing said control signal at said output.

2. The invention as set forth in claim 1 wherein said circuit means comprises a tank circuit which is tuned to said frequency which differs slightly from said certain frequency.

3. The invention as set forth in claim 2 wherein said phase detector means includes a transistor having a base, a collector and an emitter, said base providing said input and one of said emitter and collector providing said output, said tank circuit being coupled between said base and the other of said emitter and collector, and means for coupling said signal from said source to said base.

4. The invention as set forth in claim 3 wherein said tank circuit is an inductor and a capacitor connected in parallel with each other, said applying means including means coupled to said inductor for applying said 1/n frequency signals thereto, and said means for coupling said signals from said source providing capacitive coupling between said tank circuit and said base.

5. The invention as set forth in claim 4 wherein said tank circuit is connected between said emitter and said base with a feedback resistor connecting said tank circuit to said emitter and a capacitor connecting said tank circuit to said base.

6. The invention as set forth in claim 3 wherein said source is an oscillator having a frequency determining circuit, including a second inductor and voltage variable capacitor means, means connected to said one of said emitter and collector of said phase detector transistor for applying said control voltage to said voltage variable capacitor means.

7. The invention as set forth in claim 6 wherein said voltage variable capacitor means is a second transistor having collector, emitter and base electrodes, said one of said phase detector transistor emitter and collector being connected to said second transistor base, and said second transistor collector and emitter being connected across said second inductor.

8. A stabilized UHF transmitter which comprises
    oscillator means for generating an output signal having a controllable frequency and which is adapted to be transmitted at a certain frequency,
    means for providing a reference signal having a frequency which is the product of 1/n and said certain frequency, where n is an integer,
    a resonant circuit responsive to said reference signal, said resonator circuit being resonant at a frequency which is approximately equal to said certain frequency but deviates therefrom by a frequency displacement which is small as compared to said certain frequency,
    phase detector means having an active device having an input terminal to which both said oscillator means output signal is applied and said resonator circuit is connected, for phase detection in said device for developing an error signal and applying said error signal to said oscillator means for controlling the frequency of said output signal.

9. The invention as set forth in claim 8 wherein said frequency displacement is less than about 1% of said certain frequency.

10. The invention as set forth in claim 9 wherein said resonator circuit is a tank circuit including an inductor and capacitor connected in parallel to each other and tuned to be resonant at said frequency approximately equal to said certain frequency.

11. The invention as set forth in claim 10 wherein said phase detector means device provides a junction diode, said tank circuit being connected across said diode of said device so as to define a circuit having a high Q at said certain frequency, said reference signal providing means being coupled to said tank circuit.

12. The invention as set forth in claim 11 including means coupling said output signal to said diode between said tank circuit and said device.

13. The invention as set forth in claim 12 wherein said coupling means comprises a conductor for connecting said oscillator means to an antenna for applying said output signal thereto, a connection including a capacitor coupling one end of said tank circuit to said diode, said conductor and said connection being in coupled relationship with each other.

14. The invention as set forth in claim 13 wherein said device is a transistor having a base, a collector and an emitter, the portion of said transistor which provides said diode being between the base and emitter thereof.

15. The invention as set forth in claim 14 wherein said oscillator means is a voltage controlled oscillator having a frequency determining circuit including a second inductor and a second transistor, the collector and emitter of said second transistor being connected across said second inductor and the base of said second transistor being connected to the collector of said phase detector transistor so that the capacitance presented by said second transistor across said inductor is controlled by said error signal.

16. The invention as set forth in claim 15 wherein said reference signal providing means is a crystal oscillator having a third transistor including a base, a collector and an emitter, one of said third transistor collector and emitter being connected through said tank circuit inductor to complete the direct current path through the collector and emitter of said third transistor.

* * * * *